(12) United States Patent
Chiu

(10) Patent No.: US 7,047,508 B2
(45) Date of Patent: May 16, 2006

(54) METHOD FOR PERFORMING MULTI-CLOCK STATIC TIMING ANALYSIS

(75) Inventor: You-Ming Chiu, Taipei (TW)

(73) Assignee: Via Technologies Inc., Taipei (TW)

( * ) Notice: Subject to any disclaimer, the term of this patent is extended or adjusted under 35 U.S.C. 154(b) by 393 days.

(21) Appl. No.: 10/374,359

(22) Filed: Feb. 25, 2003

(65) Prior Publication Data

US 2003/0172361 A1 Sep. 11, 2003

(30) Foreign Application Priority Data

Mar. 6, 2002 (TW) ................ 91104166 A

(51) Int. Cl.
*G06F 17/50* (2006.01)
*G06F 1/04* (2006.01)
*H03K 5/12* (2006.01)

(52) U.S. Cl. .............. 716/6; 716/3; 716/2; 716/4; 716/5; 716/10; 716/18; 327/170; 327/291

(58) Field of Classification Search ............ 716/3–6, 716/10, 12, 18; 703/15; 326/56; 327/170, 327/291

See application file for complete search history.

(56) References Cited

U.S. PATENT DOCUMENTS

| | | | | |
|---|---|---|---|---|
| 5,608,888 A * | 3/1997 | Purcell et al. | ............. | 711/202 |
| 5,761,097 A * | 6/1998 | Palermo | ............. | 702/79 |
| 5,850,537 A * | 12/1998 | Selvidge et al. | ............. | 716/12 |
| 5,907,256 A * | 5/1999 | Suzuki | ............. | 327/291 |
| 5,956,256 A * | 9/1999 | Rezek et al. | ............. | 716/3 |
| 5,980,092 A * | 11/1999 | Merryman et al. | ............. | 716/6 |
| 6,205,572 B1 * | 3/2001 | Dupenloup | ............. | 716/5 |
| 6,289,491 B1 * | 9/2001 | Dupenloup | ............. | 716/5 |
| 6,301,553 B1 * | 10/2001 | Burgun et al. | ............. | 703/15 |
| 6,324,485 B1 * | 11/2001 | Ellis | ............. | 702/117 |
| 6,346,828 B1 * | 2/2002 | Rosen et al. | ............. | 326/56 |
| 6,415,420 B1 * | 7/2002 | Cheng et al. | ............. | 716/4 |
| 6,442,741 B1 * | 8/2002 | Schultz | ............. | 716/6 |
| 6,457,161 B1 * | 9/2002 | Nadeau-Dostie et al. | ...... | 716/6 |
| 6,550,045 B1 * | 4/2003 | Lu et al. | ............. | 716/6 |
| 6,664,833 B1 * | 12/2003 | Fischer | ............. | 327/170 |
| 6,698,005 B1 * | 2/2004 | Lindkvist | ............. | 716/6 |
| 6,698,006 B1 * | 2/2004 | Srinivasan et al. | ........... | 716/10 |
| 6,836,877 B1 * | 12/2004 | Dupenloup | ............. | 716/18 |
| 2002/0147951 A1* | 10/2002 | Nadeau-Dostie et al. | ... | 714/731 |
| 2004/0060022 A1* | 3/2004 | Allen et al. | ............. | 716/6 |

\* cited by examiner

*Primary Examiner*—A. M. Thompson
*Assistant Examiner*—Helen Rossoshek
(74) *Attorney, Agent, or Firm*—Thomas, Kayden, Horstemeyer & Risley

(57) ABSTRACT

A method for performing multi-clock static timing analysis to determine whether a timing violation occurs on a logic circuit. A set of clock signals that are expected to cause a logic circuit to be in a worst-case situation if analyzed by using static timing analysis can be selected from a number of possible clock signals by using a simple determination process. The selected set of clock signals are then employed in static timing analysis on the logic circuit to verify whether no timing violation occurs on each signal transmission path of the logic circuit. If not, it indicates that the logic circuit using any selection of the possible clock signals will not cause timing violation thereon. Thus, the static timing analysis can be accomplished efficiently.

22 Claims, 5 Drawing Sheets

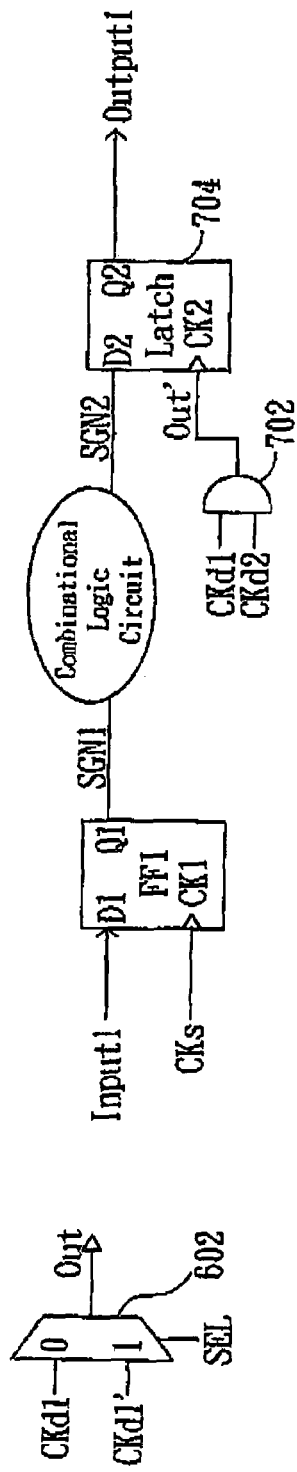
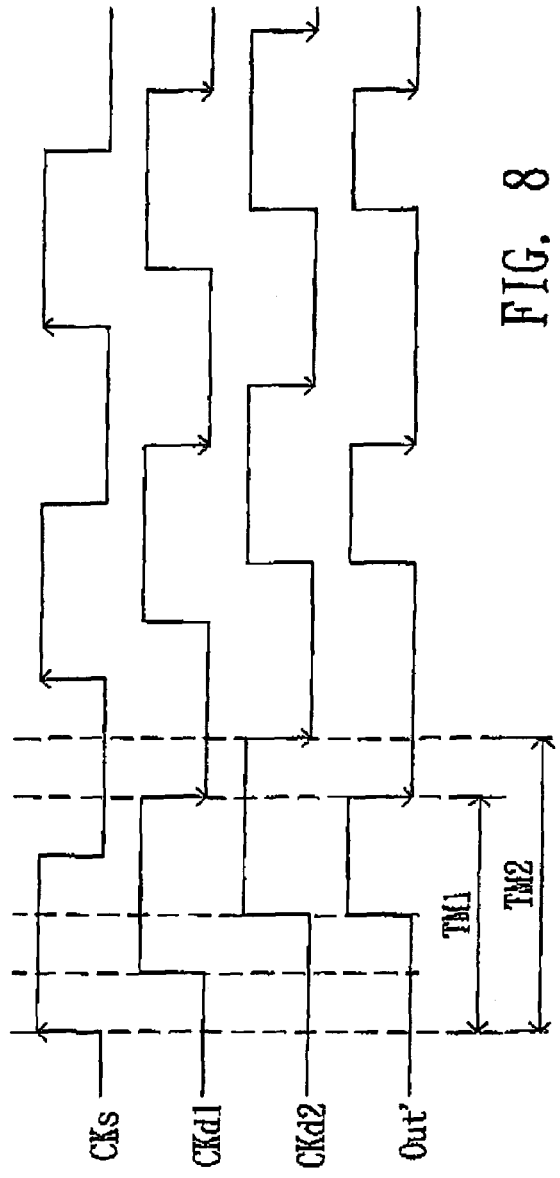
FIG. 6
FIG. 7
FIG. 8

METHOD FOR PERFORMING MULTI-CLOCK STATIC TIMING ANALYSIS

This application claims the benefit of Taiwan application Serial No. 091104166, filed on Mar. 6, 2002.

BACKGROUND OF THE INVENTION

1. Field of the Invention

The invention relates to a method of static timing analysis, and more particularly to a method for performing static timing analysis on a multi-clock logic circuit.

2. Description of the Related Art

During the development process of an integrated circuit, computer-aided design (CAD) software is frequently used to perform various analyses to verify the circuit design and examine its performance so as to improve it. The timing analysis tool is one of the CAD software widely used for predicting the performance and accuracy of the designed circuit.

Timing analysis is generally categorized into two types: dynamic timing analysis and static timing analysis (STA). The dynamic timing analysis provides the most detailed and accurate simulated results of a circuit, which take a long time to obtain. Static timing analysis, on the other hand, provides a time saving method to predict the performance of a circuit and determine if the timing of the circuit is correct according to design expectations. Static timing analysis provides not only a complete timing path validation, but also a fast way to find out the critical paths on which timing violations may occur.

FIG. 1 illustrates a circuit that is verified by using conventional static timing analysis. All the logic elements connected between a flip-flop (FF) 102 and FF 104 are represented as a combinational logic circuit 106. The FF 102 is used for receiving an input signal Input2 and a source clock signal CKs, and outputting a signal SGN1 to the combinational logic circuit 106. In addition, the combinational logic circuit 106 further receives an input signal Input1 and outputs a signal SGN2 and an output signal Output1. The FF 104 is used to receive the signal SGN2 and a destination clock signal CKd, and produces the output signal Output2.

The static timing analysis on a circuit is referred to performing a timing analysis on all signal transmission paths of the circuit from each beginning terminal to each end terminal, as well as reporting whether any one of the signal transmission paths on which timing violations occur. The beginning terminal can be an input port or clock pin, and the end terminal can be an output port or an input data terminal of the flip-flop device. In FIG. 1, four signal transmission paths are found as follows: (1) the path between the input signal Input1 and the output signal Output1, (2) the path between the input signal Input1 and the signal SGN2, (3) the path between the input signal Input2 and the output signal Output1, and (4) the path between the input signal Input2 and the signal SGN2. Static timing analysis can be used to verify whether the four signal transmission paths satisfy the timing requirement. If so, it indicates that no timing violation occur on the circuit.

However, the conventional static timing analysis tool may result in faulty results and is difficult to use when the FF's clock input terminal CK in the circuit to be analyzed has multiple options of clock signals, such as an FF 204 of a logic circuit with multiple clock signals, as shown in FIG. 2. The clock input terminal CK1 of the FF 202 receives a source clock signal CKs and clock input terminal CK2 of the FF 204 receives the clock Out. The clock Out is the output signal of a multiplexer 206. The multiplexer 206 can receive a first destination clock CKd1 and a second destination clock CKd2. The multiplexer 206, controlled by a selection signal SEL, selects either the first destination clock CKd1 or the second destination clock CKD2 as the clock Out. When performing the static timing analysis on the circuit as shown in FIG. 2, the conventional static timing analyzer possibly performs analysis on the situation with respect to one of the destination clock signals only, and ignores the situation with respect to the other destination clock signal. In this case, the critical path on which a timing violation may occur will not be found. As a result, in some situations, faulty results are produced because the potential critical path where the timing violation occur cannot be identified.

Another approach to performing static timing analysis on the circuit shown in FIG. 2 is to set case parameters in the static timing analyzer, that is, to perform a set case analysis. In other words, the user can set different cases with respect to all possible clock signals that would be received by the clock input terminals CK1 and CK2 of the FFs 202 and 204 respectively, and analyze those cases separately. If the clock input terminals CK1 and CK2 of the FFs 202 and 204 can respectively receive one of M source clock signals and one of N destination clock signals, M times N static timing analyses should be performed and the user needs to set up those cases for M by N times. In this situation, the user needs to spend a lot of time for the set case analysis, which is very inefficient use of time and is inconvenient for the user during the circuit developing process. Thus, it is desirable to have a static timing analysis approach that is efficient and easy to use for performing analysis on such circuit.

SUMMARY OF THE INVENTION

It is therefore an objective of the invention to provide a method for performing multi-clock static timing analysis on a multi-clock sequential logic circuit. A set of clock signals that are expected to cause a sequential logic circuit to be in a worst-case situation if analyzed by using static timing analysis can be selected from a number of possible clock signals by using a simple determination process. The selected set of clock signals are then employed in static timing analysis on the sequential logic circuit to verify whether no timing violation occurs on each signal transmission path of the sequential logic circuit. If not, it indicates that the sequential logic circuit using any selection of the possible clock signals will not cause timing violation thereon. Thus, the static timing analysis can be accomplished efficiently.

The invention achieves the above-identified object by providing a method for performing multi-clock static timing analysis to determine whether a timing violation occurs on a sequential logic circuit. The sequential logic circuit includes a first sequential logic gate, a combinational logic circuit, and a second sequential logic gate. The output signal outputted from the first sequential logic gate is transmitted to the second sequential logic gate via a number of signal transmission paths of the combinational logic circuit. The clock input terminal of the first sequential logic gate can receive one of the source clock signals, and the clock input terminal of the second sequential logic gate can receive one of the destination clock signals. The method for performing multi-clock static timing analysis includes the following steps. First, a plurality of source-to-destination edge time margins are determined by comparison of each of the destination clock signals with each of the source clock signals. A smallest edge time margin is then selected from the source-to-destination edge time margins, wherein the smallest edge time margin is associated with one of the source clock signals and one of the destination clock signals. Next, whether a timing violation occurs on the signal transmission paths is determined by performing static time analysis on the sequential logic circuit using the source clock signal and the destination clock signal which both are associated with the smallest edge time margin.

According to the objective of the invention, a method for performing multi-clock static timing analysis is provided to determine whether a timing violation occurs on a sequential logic circuit. The sequential logic circuit includes a first sequential logic gate, a combinational logic circuit, and a second sequential logic gate. The output signal outputted from the first sequential logic gate is transmitted to the second sequential logic gate via a number of signal transmission paths of the combinational logic circuit. The clock input terminal of the first sequential logic gate can receive one of a number M of the source clock signals, and the clock input terminal of the second sequential logic gate can receive one of a number N of the destination clock signals, in which M and N are positive integers. This method of static timing analysis includes the following steps. First, M*N source-to-destination edge time margins are determined by comparison of each of the M source clock signals with each of the N destination clock signals. A smallest of the edge time margins is then selected from the source-to-destination edge time margins, wherein the smallest edge time margin is associated with one of the source clock signals and one of the destination clock signals. Next, whether a timing violation occurs on the signal transmission paths is determined by performing static time analysis on the sequential logic circuit using the source clock signal and the destination clock signal which both are associated with the smallest edge time margin.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 6 is a schematic diagram showing an equivalent circuit of the multiplexer with the XOR gate in FIG. 5.

FIG. 7 is a schematic diagram showing a sequential logic circuit using an AND gate.

FIG. 8 is a timing diagram illustrating the timing relationship between the source clock CKs, the first destination clock CKd1, the second destination clock CKd2, and the clock Out' with reference to FIG. 7.

DETAILED DESCRIPTION OF THE INVENTION

The spirit of the invention is to select a set of source and destination clock signals that can make a sequential logic circuit have the worst-case behavior from a number of source and destination clock signals for the sequential logic circuit, and then to verify whether no timing violation occurs on each signal transmission path of the sequential logic circuit by using static timing analysis using the selected set of clock signals. If no timing violation occurs, it indicates that the sequential logic circuit using any selection of the possible source and destination clock signals will not cause timing violation thereon. Thus, the static timing analysis can be accomplished efficiently.

According to the invention, a method for performing multi-clock static timing analysis to determine whether a timing violation occurs on a sequential logic circuit. The sequential logic circuit includes a first sequential logic gate, a combinational logic circuit, and a second sequential logic gate. The output signal outputted from the first sequential logic gate is transmitted to the second sequential logic gate via a number of signal transmission paths of the combinational logic circuit. The clock input terminal of the first sequential logic gate can receive one of the source clock signals, and the clock input terminal of the second sequential logic gate can receive one of the destination clock signals. The method for performing multi-clock static timing analysis includes the following steps. First, a plurality of source-to-destination edge time margins are determined by comparison of each of the destination clock signals with each of the source clock signals. A smallest edge time margin is then selected from the source-to-destination edge time margins, wherein the smallest edge time margin is associated with one of the source clock signals and one of the destination clock signals which make the sequential logic circuit behave in its worst case. Next, whether a timing violation occurs on the signal transmission paths is determined by performing static time analysis on the sequential logic circuit using the source clock signal and the destination clock signal which both are associated with the smallest edge time margin. If no timing violation occurs, it indicates that the sequential logic circuit using any selection of the possible source and destination clock signals will not cause timing violation thereon. Thus, the static timing analysis can be accomplished efficiently. In this way, a complete timing analysis is completed in a simple determination process, providing convenience to the circuit designers.

Figure 1:
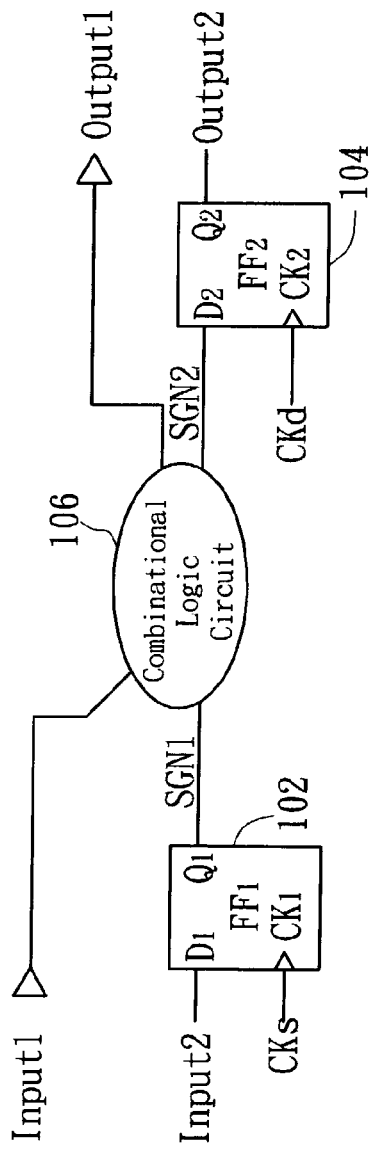
FIG. 1 is a schematic diagram illustrating a typical logic circuit that is verified by static timing analysis.
Figure 2:
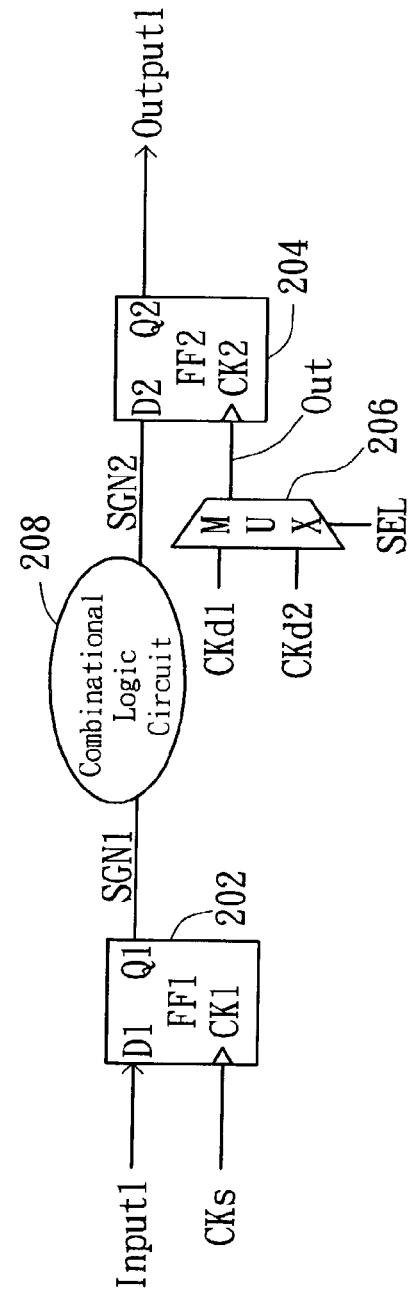
FIG. 2 illustrates a logic circuit with multiple clock signals.
Figure 3:
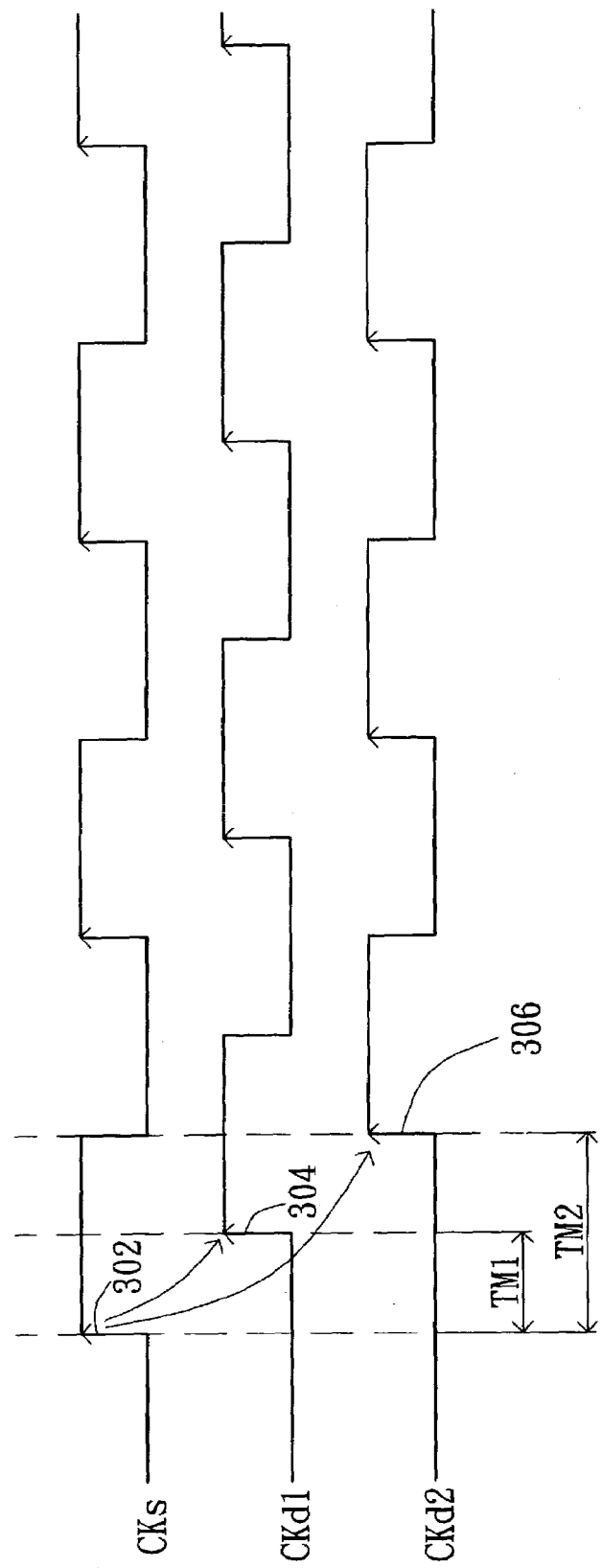
FIG. 3 is a timing diagram showing respective examples of the source clock CKs, the first destination clock CKd1, and the second destination clock CKd2 used in FIG. 2.

An example of the source clock signal CKs, the first destination clock signal CKd1, and the second destination clock signal CKd2 in FIG. 2 are shown in FIG. 3. In this example an assumption will be made that each of the source and destination clock signals has a time period of 20 ms, and the first destination clock CKd1 lags behind the source clock CKs by 5 ms, and the second destination clock CKd2 lags behind the first destination clock CKd1 by 5 ms. When the method for performing multi-clock static timing analysis begins, a first source-to-destination edge time margin between the source clock CKs and the first destination clock CKd1, and a second source-to-destination edge time margin between the source clock CKs and the second destination clock CKd2 are determined according to the invention. If the flip-flop (FF) 204 is a positive-edge-triggered FF, the first source-to-destination edge time margin is the time difference between a rising edge of the source clock CKs and the closest rising edge of the first destination clock CKd1, such as the source-to-destination edge time margin TM1 between the rising edges 302 and 304. Likewise, the second source-to-destination edge time margin is the time difference between a rising edge of the source clock CKs and the closest rising edge of the second destination clock CKd2, such as the source-to-destination edge time margin TM2 between the rising edges 302 and 306. As can be seen from FIG. 3, since the source-to-destination edge time margin TM1 is smaller than the source-to-destination edge time margin TM2, the invention selects the smaller edge time margin, TM1, which is associated with the source clock CKs and the first destination clock CKd1. Static timing analysis is then performed on the sequential logic circuit using the source clock CKs and the first destination clock CKd1 to identify if a timing violation occurs on the signal transmission paths of the combinational logic circuit 208 shown in FIG. 2. In addition, during the static timing analysis, a critical path that highly probably has a timing violation is first found, and a determination can then made as to whether a timing violation has occurred on the critical path. If no timing violation occurs on the critical path, it indicates that no timing violation occurs on any of the signal transmission paths.

The reason to select the minimum of the edge time margins is that the smallest edge time margin will correspond to the rising edge of the destination clock signal that first follows the rising edge of the source clock signal CKs. For example, the rising edge 304 of CKd1 first follows the rising edge 302 of the source clock signal CKs, as shown in FIG. 3. Thus, as compared with the rising edge 306, the rising edge 304 causes signal SGN2 in FIG. 2 to need to satisfy a stricter setup time requirement of the flip-flop 204. In other words, the signal SGN2 needs to be valid and stable much earlier to prevent a timing violation when the first destination clock CKd1 is applied to the clock input terminal of the flip-flop 204, as compared with the application of the second destination clock CKd2. That is, when the first destination clock CKd1 is used, the results of the static timing analysis on the entire circuit will be worse. Therefore, when checking whether the signal SGN2 meets the setup time requirement of the FF, the destination clock signal that highly probably causes a timing violation on the signal transmission paths can be selected by only doing comparison of the source-to-destination edge time margins with respect to the destination clock signals. The selected destination clock signal can be used in analyzing the signal transmission paths of the combinational logic circuit 208 in FIG. 2. Since the selected destination clock signal has the highest probability of causing a timing violation on the signal transmission paths, if static timing analysis is performed with respect to this destination clock signal, and there is no timing violation on each of the signal transmission paths, it indicates that no timing violation will occur no matter which of the destination clock signals is used in static timing analysis on the entire circuit. In this case, only performing the static timing analysis on the entire circuit with respect to the selected destination clock signal can be regarded as performing static timing analyses on the entire circuit with respect to the respective destination clock signals.

Therefore, the invention provides a simple, efficient, and effective way of performing static timing analysis. As disclosed above, the destination clock signal that possibly affects the critical paths' performance can be determined by using a simple determination process involving comparing the source-to-destination time edge margins and selecting the minimum one from them. Unlike the conventional approach that requires the user to conduct set case analysis for each possible case, the invention needs only one determination process to identify the destination and source clock signals that are associated with the minimum time edge margin, and completes static timing analysis on the entire circuit using the associated destination and source clock signals. Thus, the use of invention is convenient and can achieve complete timing analysis on the entire circuit effectively. In contrast, when the user does not preset the clock signals on the conventional timing analysis tool, the conventional timing analysis tool performs static timing analysis on the entire circuit with only an arbitrarily chosen one of the destination clock signals as an input of the FF 204 in FIG. 2, ignoring the cases with other destination clock signals.

In addition to the sequential logic circuit shown in FIG. 2, the method is applicable to other logic circuit. For example, the method is still applicable to the logic circuit shown in FIG. 2 with the FFs 202 and 204 replaced by other types of sequential logic gates, such as latches. Further, the FFs 202 and 204 can be specifically positive-edge-triggered or negative-edge-triggered FFs. Latches, such as active-high or active-low latches can be used also. The multiplexer can also be replaced by other selection devices which allows the clock input terminal CK2 of the flip-flop 204 to receive one of different destination clock signals.

The definition of source-to-destination time edge margin may be different when the sequential logic gates that receive the respective source and destination clock signals are different. As described above, when the positive-edge-triggered FFs are used in FIG. 2, the first edge time margin is a time difference between a rising edge of the source clock signal and the closest rising edge of the first destination clock signal and the second edge time margin is a time difference between a rising edge of the source clock signal and the closest rising edge of the second destination clock signal. When the negative-edge-triggered FFs are used, the first edge time margin is a time difference between a rising edge of the source clock signal and the closest falling edge of the first destination clock signal, and the second edge time margin is a time difference between a rising edge of the source clock signal and the closest falling edge of the second destination clock signal. When active-high latches are used, the first edge time margin is a time difference between a rising edge of the source clock signal and the closest falling edge of the first destination clock signal, and the second edge time margin is a time difference between a rising edge of the source clock signal and the closest falling edge of the second destination clock signal. This is because the latch samples its input data signal and locks at an output level only when the input clock has a high-to-low transition in voltage level. In this case, the source-to-destination edge time margin is defined based on the falling edge of the destination clock signal. Conversely, if active-low latches are used, the source-to-destination edge time margin is defined based on the rising edge of the destination clock signal.

In addition, when there is multiple choices of source clocks for the first FF, the invention can still be suitable for use. Further still, the method of the invention is suitable for use if the number of the destination clock signals for selection is greater than two. For example, the clock input terminal CK2 of the FF 204 in FIG. 2 can be fed with one of N destination clock signals, where N is a positive integer.

Suppose the clock input terminal CK1 of the FF 202 in FIG. 2 can receive one of M source clock signals. The method for performing static timing analysis thus includes the following steps. First, M*N source-to-destination edge time margins are determined by comparison of each of the M source clock signals with each of the N destination clock signals. A smallest edge time margin is then selected from the source-to-destination edge time margins, wherein the smallest edge time margin is associated with one of the source clock signals and one of the destination clock signals. Next, whether a timing violation occurs on the signal transmission paths is determined by performing static time analysis on all of the signal transmission paths of the sequential logic circuit using the source clock signal and the destination clock signal which both are associated with the smallest edge time margin.

Figure 4:
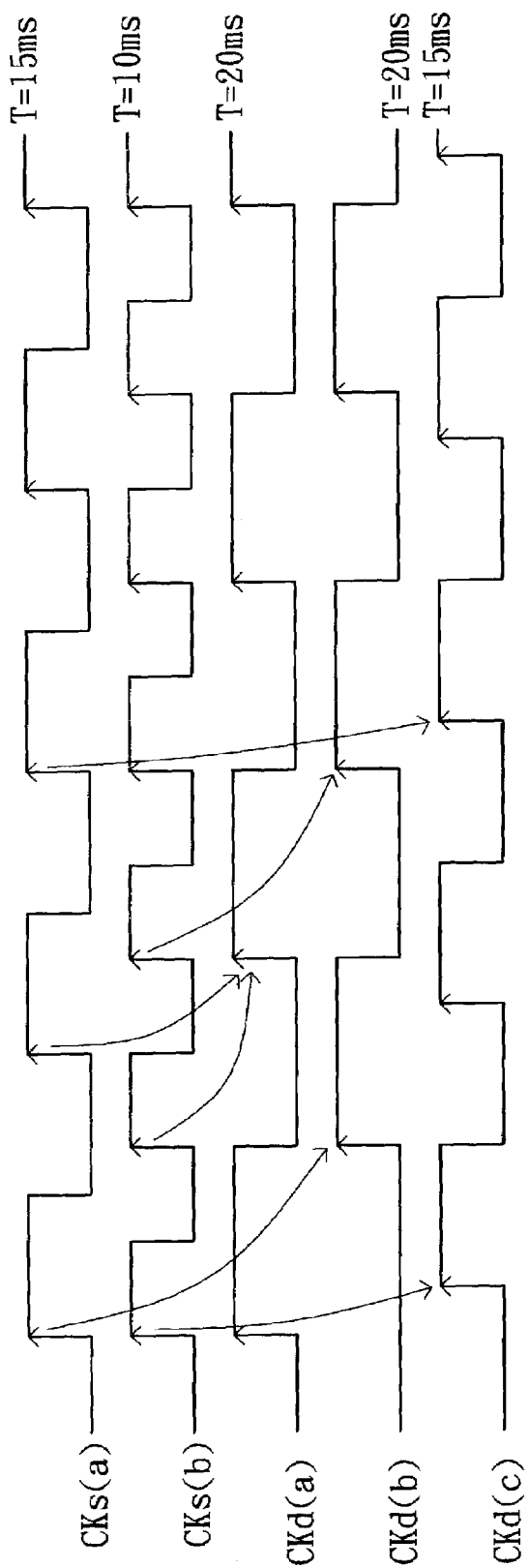
FIG. 4 is a timing diagram illustrating the timing relationship between two source clock signals and three destination clock signals.

An example of two source clock signals and three destination clock signals available to use in timing analysis is illustrated in FIG. 4. The clock input terminal CK1 of FF 202 in FIG. 2 is used to receive one of the two source clock signals CKs (a) or CKs (b). The source clock CKs (a) has a period of 15 ms (T=15 ms), and the source clock CKs (b) has a period of 10 ms (T=10 ms). The clock receiving terminal CK2 of FF 204 is used to receive one of three destination clock signals CKd (a), CKd (b), and CKd (c). The destination clock CKd (a) has a time period of 20 ms; destination clock CKd (b) has a time period of 20 ms and has a phase inversion with respect to destination clock CKd (a); and destination clock CKd (c) has a time period of 15 ms and lags behind the source clock CKs (a) by 2.5 ms. By assuming that the flip-flops are positive-edge-triggered, the edge time margins are defined by the rising edge of the destination clock.

First, the source and destination clock signals that correspond to the strictest setup time requirements of the flip-flop are identified. That is, six source-to-destination time edge margins are first determined by comparison of each of the two source clock signals with each of the three destination clock signals. The six source-to-destination time edge margins are as follows: The first source-to-destination edge time margin between CKs(a) and CKd(a) is 5 ms. The second source-to-destination edge time margin between CKs (a) and CKd(b) is 10 ms. The third source-to-destination edge time margin between CKs (a) and CKd (c) is 2.5 ms. The fourth source-to-destination edge time margin between CKs (b) and CKd (a) is 10 ms. The fifth source-to-destination edge time margin between CKs (b) and CKd (b) is 10 ms. The sixth source-to-destination edge time margin between CKs (b) and CKd (c) is 2.5 ms.

As can be examined from the above, the third and the sixth source-to-destination edge time margins are of the smallest values. These two edge time margins, when used for analysis, will yield the same results. The source and destination clock signals that are associated with the smallest edge time margin, that is, the source clock CKs(a) and the destination clock CKd(c), are then used in the static timing analysis on the logic circuit so as to determine whether a timing violation occurs on all of the transmission paths of the logic circuit.

Furthermore, the foregoing multiplexer can also be replaced by the other selection devices, such as the XOR gate, the AND gate, and the OR gate. The related circuits are shown in FIGS. 5, 7, and 9 respectively.

Figure 5:
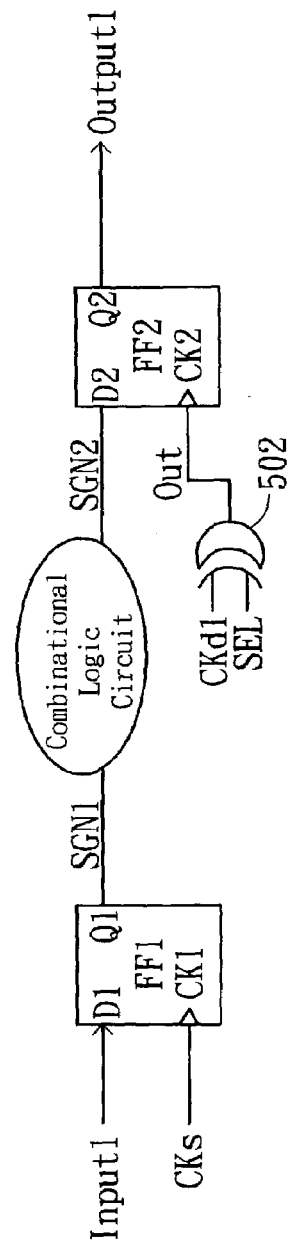
FIG. 5 is a schematic diagram illustrating a sequential logic circuit using an XOR gate.

In FIG. 5, the first destination clock CKd1 and the selection signal SEL are fed to the XOR gate 502 which produces a clock signal Out. According to the property of the XOR gate 502, the clock signal Out is equal to CKd1*SEL'+ CKd1'*SEL, in which the Boolean function is equivalent to the multiplexer 602 shown in FIG. 6. In FIG. 6, the inputs of multiplexer 602 are the first destination clock CKd1 and its anti-phase signal CKd1', and the multiplexer 602 is controlled by the selection signal SEL. As a result, when the circuit shown in FIG. 5 is analyzed, the XOR gate 502 can be replaced by multiplexer 602 shown in FIG. 6. That is, the circuit in FIG. 5 is equivalent to the circuit in FIG. 2, and the method of performing multi-clock static timing analysis can be applied to the circuit in FIG. 5 for timing analysis.

In FIG. 7, the first destination clock CKd1 and the second destination clock CKd2 are fed to the AND gate 702 at the same time, causing a clock signal Out' to be outputted to latch device 704. As an example, a timing diagram showing the relationship between the source clock CKs, the first destination clock CKd1, the second destination clock CKd2 and the clock signal Out' is shown in FIG. 8. While the static timing analysis is in process on the circuit in FIG. 7 with the latch device 704 as an active-high latch, the definition of the edge time margin must be based on falling edges of the source and destination clock signals. When the method for performing multi-clock static timing analysis is performed on the circuit shown in FIG. 7, a first source-to-destination time edge margin between the source clock signal CKs and a first destination signal CKd1 are determined as TM1, and a second source-to-destination time edge margin between the source clock signal CKs and a second destination signal CKd2 are determined as TM2. The first source-to-destination time edge margin TM1 is then selected as the minimum time edge margin since it is less than the second source-to-destination time edge margin TM2. Next, static timing analysis is performed on the circuit shown in FIG. 7 using the source clock signal CKs and the destination clock signal CKd1 so as to determine whether a timing violation occurs on the signal transmission paths of the circuit. Note that the method of the invention is also applicable to the circuit, as shown in FIG. 7, with the latch device 704 replaced by a negative-edge-triggered flip-flop.

Figure 9:
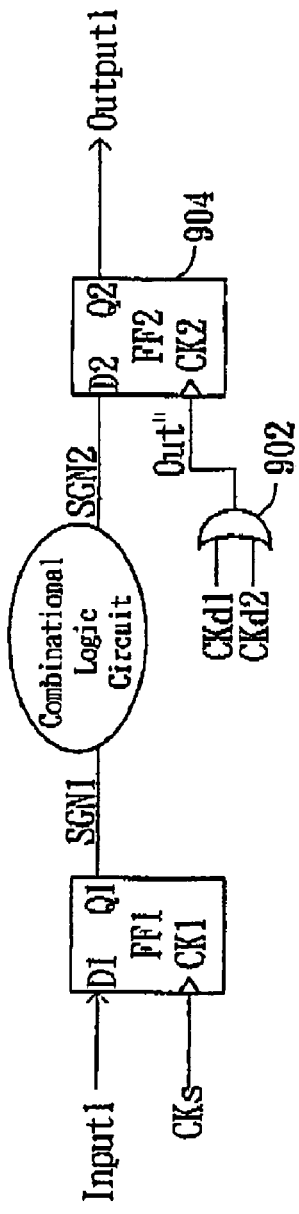
FIG. 9 is a schematic diagram showing a sequential logic circuit using an OR gate.
Figure 10:
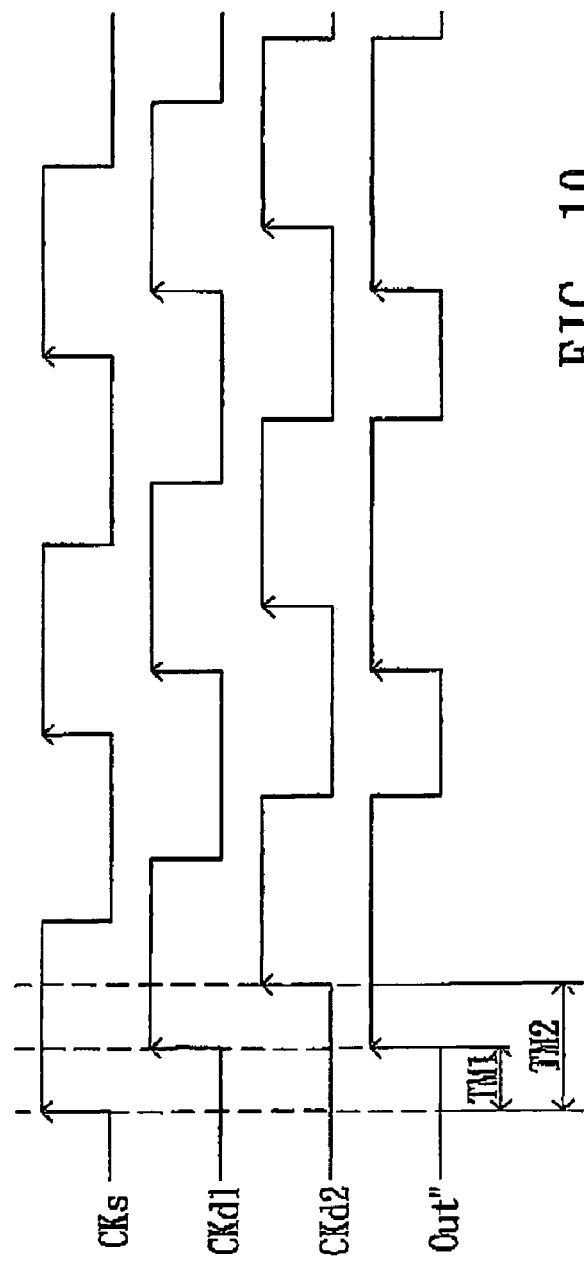
FIG. 10 is a timing diagram illustrating the timing relationship between the source clock CKs, the first destination clock CKd1, the second destination clock CKd2, and the clock Out" with respect to FIG. 9.

In FIG. 9, the first destination clock CKd1 and the second destination clock CKd2 are fed to the OR gate 902 which outputs a clock signal Out" to a flip-flop 904. As an example, a timing diagram showing the relationships between the source clock CKs, the first destination clock CKd1, the second destination clock CKd2, and the clock signal Out" is shown in FIG. 10. The flip-flop 904 is a positive-edge-triggered FF. While the static timing analysis is in process, the edge time margin is defined based on the rising edges of the source and destination clock signals. When the method of the invention is applied to perform analysis on the circuit shown in FIG. 9, the first source-to-destination edge time margin TM1 between the source clock CKs and the first destination clock CKd1 is determined and less than the second source-to-destination edge time margin TM2 between the source clock CKs and the second destination clock CKd2. In this situation, the first destination clock CKd1 can be selected for use in static timing analysis on the circuit shown in FIG. 9 to determine whether a timing violation occurs on any of the signal transmission paths, and then the static timing analysis can be completed. Additionally, when flip-flop 904 in FIG. 9 is replaced by a active-low latch device, the method of the invention can also be suitable for use.

Up to this point, the method of the invention can be represented in terms of algorithm as follows:

Step 1: SET min=infinity (∞);

Step 2: determine whether the definition of source-to-destination edge time margin is made on a positive-edge-triggered or a negative-edge-triggered base;

Step 3: FOR (all of the source clock signals)
FOR (all of the destination clock signals)

SET delta=(triggering time of the destination clock signal)−(triggering time of the source clock signal);

IF delta<min, THEN LET min=delta.

In the forgoing algorithm, two loops are employed to determine the smallest of the source-to-destination edge time margins between the source clock signals and destination clock signals. In step 2, a determination as to whether the source-to-destination edge time margin definition is made on either a positive-edge-triggered or negative-edge-triggered basis depends on the characteristic of the sequential logic gate employed in the circuit.

In the foregoing embodiment, the invention is illustrated by performing setup time analysis of the static timing analysis on a circuit. Additionally, the spirit of the invention is also suitable for use in hold time analysis. The difference between the two analyses is that during the setup time analysis the edge time margin is calculated according to a rising edge of the source clock and the closest lagging rising edge of the destination clock signal. In the hold time analysis, the edge time margin is calculated according to a rising edge of the source clock and the closest leading rising edge of the destination clock signal, and the edge time margin calculated in this way is negative. Therefore, the algorithm suitable for use in the hold time analysis is as follows:

Step 1: SET max=negative infinity (−∞);

Step 2: determine whether the definition of source-to-destination edge time margin is made on a positive-edge-triggered or a negative-edge-triggered base;

Step 3: FOR (all of the source clock signals)
FOR (all of the destination clock signals)

SET delta=(triggering time of the destination clock)−(triggering time of the source clock);

IF delta>max, THEN LET max=delta.

In summary, the preferred embodiment of the invention has disclosed a method for performing multi-clock static timing analysis on a sequential logic circuit. A worst-case timing setting can be selected from a number of source and destination clocks in a simple determination process. The worst-case timing setting can then be employed in static timing analysis to be performed on the entire circuit. Next, whether a timing violation occurs on the signal transmission paths of the entire circuit can be determined by performing static timing analysis on the entire circuit using the worst-case timing settings. If no timing violation is detected, it indicates that any selection of the source and destination clock signals can be employed and timing violations will not occur on any of the signal transmission paths. As a result, the invention achieves a complete and convenient analysis.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for performing multi-clock static timing analysis to determine whether a timing violation occurs on a sequential logic circuit including a first sequential logic gate, a combinational logic circuit, and a second sequential logic gate, wherein an output signal outputted from the first sequential logic gate is transmitted to the second sequential logic gate via a plurality of signal transmission paths of the combinational logic circuit; one of a plurality of source clock signals is selected and then inputted to a clock input terminal of the first sequential logic gate; and one of a plurality of destination clock signals is selected and then inputted to a clock input terminal of the second sequential logic gate, the method comprising the steps of:

determining a plurality of source-to-destination edge time margins which are the time difference between a rising/falling edge of each destination clock signal and the rising/falling edge of each source clock signal, the selection of the rising edge or the falling edge of the clock signals are determined according to the characteristics of the corresponding sequential logic gate;

selecting a smallest edge time margin from the source-to-destination edge time margins, wherein the smallest edge time margin is associated with one of the source clock signals and one of the destination clock signals; and determining whether a timing violation occurs on the signal transmission paths by performing static timing analysis on the sequential logic circuit using the source clock signal and the destination clock signal which both are associated with the smallest edge time margin, wherein if no timing violation occurs, the sequential logic circuit is verified, that when the sequential logic circuit receiving any other one of the source clock signals and any other one of the destination clock signals, the timing violation will not occur, whereby the static timing analysis is accomplished efficiently.

2. The method as recited in claim 1, wherein the first sequential logic gate is a flip-flop.

3. The method as recited in claim 1, wherein the second sequential logic gate is a flip-flop.

4. The method as recited in claim 3, wherein the flip-flop is a positive-edge-triggered flip-flop, and the source-to-destination edge time margins are each determined by measuring a time difference between a rising edge of each of the source clock signals and a closest rising edge of each of the destination clock signals.

5. The method as recited in claim 3, wherein the flip-flop is a negative-edge-triggered flip-flop, wherein the source-to-destination edge time margins are each determined by measuring a time difference between a rising edge of each of the source clock signals and a closest falling edge of each of the destination clock signals.

6. The method as recited in claim 1, wherein the second sequential logic gate is a latch device.

7. The method as recited in claim 6, wherein the latch device is an active-high latch.

8. The method as recited in claim 6, wherein the latch device is an active-low latch.

9. The method as recited in claim 1, wherein the clock input terminal of the second sequential logic gate receives one of the destination clock signals selected by a multiplexer.

10. The method as recited in claim 1, wherein the clock input terminal of the second sequential logic gate receives what is generated by AND gating.

11. The method as recited in claim 1, wherein the clock input terminal of the second sequential logic gate receives what is generated by OR gating.

12. The method as recited in claim 1, wherein the clock input terminal of the second sequential logic gate receives what is generated by XOR gating.

13. A method for performing multi-clock static timing analysis to determine whether a timing violation occurs on a sequential logic circuit including a first sequential logic gate, a combinational logic circuit, and a second sequential logic gate, wherein an output signal outputted from the first sequential logic gate is transmitted to the second sequential logic gate via a plurality of signal transmission paths of the combinational logic circuit, one of M source clock signals is selected and then inputted to a clock input terminal of the first sequential logic gate, and one of N destination clock signals is selected and then inputted to a clock input terminal of the second sequential logic gate, in which M and N are positive integers, the method comprising the steps of:

determining M*N source-to-destination edge time margins which are the time difference between the rising/falling edge of each source clock signal and the rising/falling edge of each destination clock signals, the selection of the rising edge or the falling edge of the clock signals are determined according to the characteristics of the corresponding sequential logic gate;

selecting a smallest edge time margin from the source-to-destination edge time margins, wherein the smallest edge time margin is associated with one of the source clock signals and one of the destination clock signals; and determining whether a timing violation occurs on the signal transmission paths by performing static timing analysis on the sequential logic circuit using the source clock signal and the destination clock signal which both are associated with the smalles edge time margin, wherein if no timing violation occurs, the sequential logic circuit is verified, that when the sequential logic circuit receiving any other one of the source clock signals and any other one of the destination clock signals, the timing violation will not occur, whereby the static timing analysis is accomplished efficiently.

14. The method as recited in claim 13, wherein the first sequential logic gate is a flip-flop.

15. The method as recited in claim 13, wherein the second sequential logic gate is a flip-flop.

16. The method as recited in claim 15, wherein the flip-flop is a positive-edge-triggered flip-flop, and the M*N source-to-destination edge time margins are each determined by measuring a time difference between a rising edge of each of the M source clock signals and a closest rising edge of each of the N destination clock signals.

17. The method as recited in claim 15, wherein the flip-flop is a negative-edge-triggered flip-flop, wherein the M*N source-to-destination edge time margins are each determined by measuring a time difference between a rising edge of each of the M source clock signals and a closest falling edge of each of the N destination clock signals.

18. The method as recited in claim 13, wherein the second sequential logic gate is a latch device.

19. The method as recited in claim 18, wherein the latch device is an active-high latch.

20. The method as recited in claim 18, wherein the latch device is an active-low latch.

21. The method as recited in claim 13, wherein the clock input terminal of the second sequential logic gate receives one of the destination clock signals selected by a multiplexer.

22. A method for performing multi-clock static timing analysis to determine whether a timing violation occurs on a sequential logic circuit including a first sequential logic gate, a combinational logic circuit, and a second sequential logic gate, wherein an output signal outputted from the first sequential logic gate is transmitted to the second sequential logic gate via a plurality of signal transmission paths of the combinational logic circuit; a clock input terminal of the first sequential logic gate receives what is generated by gating a plurality of source clock signals; and a clock input terminal of the second sequential logic gate receives what is generated by gating a plurality of destination clock signals, the method comprising the steps of:

determining a plurality of source-to-destination edge time margins which are the time difference between the rising/falling edge of each destination clock signal and the rising/falling edge of each source clock signal, the selection of the rising edge or the falling edge of the clock signals are determined according to the characteristics of the corresponding sequential logic gate;

selecting a smallest edge time margin from the source-to-destination edge time margins, wherein the smallest edge time margin is associated with one of the source clock signals and one of the destination clock signals; and determining whether a timing violation occurs on the signal transmission paths by performing static timing analysis on the sequential logic circuit using the source clock signal and the destination clock signal which both are associated with the smallest edge time margin, wherein if no timing violation occurs, the sequential logic circuit is verified, that the sequential logic circuit receiving what is generated by gating the source clock signals and what is generated by gating the destination clock signals will not cause timing violation thereon, whereby the static timing analysis is accomplished efficiently.

* * * * *